United States Patent [19]
Leon et al.

[11] Patent Number: 6,119,210
[45] Date of Patent: Sep. 12, 2000

[54] DEVICE FOR THE PROTECTION OF STORED DATA USING A TIME DELAY CIRCUIT

[75] Inventors: Jean-François Leon, Biver; Sébastien Zink, Aix en Provence, both of France

[73] Assignee: SGS-Thomson Microelectronics S.A., Gentilly, France

[21] Appl. No.: 08/915,855

[22] Filed: Aug. 21, 1997

[30] Foreign Application Priority Data

Aug. 27, 1996 [FR] France ................................ 96 10589

[51] Int. Cl.⁷ .................................................... G06F 12/14
[52] U.S. Cl. ...................... 711/163; 711/103; 711/167; 713/200; 713/202; 713/502
[58] Field of Search .................... 711/163, 167, 711/103; 713/200, 202, 502

[56] References Cited

U.S. PATENT DOCUMENTS

| | | | |
|---|---|---|---|
| 4,485,456 | 11/1984 | Toyoda | 364/900 |
| 4,580,246 | 4/1986 | Sibigtroth | 365/189 |
| 4,791,614 | 12/1988 | Arakawa | 365/228 |
| 5,315,549 | 5/1994 | Scherpenberg et al. | 365/189.09 |
| 5,343,085 | 8/1994 | Fujimoro et al. | 307/272.3 |
| 5,430,882 | 7/1995 | Tilghman et al. | 395/750 |
| 5,557,576 | 9/1996 | Roohparvar et al. | 365/218 |
| 5,577,195 | 11/1996 | Gochi | 395/182.2 |
| 5,644,538 | 7/1997 | Merritt | 365/194 |
| 5,668,760 | 9/1997 | Hazen | 365/189.01 |
| 5,787,040 | 7/1998 | Leon et al. | 365/189.01 |

FOREIGN PATENT DOCUMENTS

| | | | |
|---|---|---|---|
| 0 186 832 | 7/1986 | European Pat. Off. | G11C 5/00 |
| 0250242 | 12/1987 | European Pat. Off. | G11C 17/00 |
| 0 278 428 | 8/1988 | European Pat. Off. | G06F 1/00 |
| 0 406 442 | 1/1991 | European Pat. Off. | G06F 12/16 |

OTHER PUBLICATIONS

French Search Report from French Patent Application 96 10589, filed Aug. 28, 1996.

*Primary Examiner*—Hiep T. Nguyen
*Attorney, Agent, or Firm*—Wolf, Greenfield & Sacks, P.C.; James H. Morris; Theodore E. Galanthay

[57] ABSTRACT

Disclosed is a device for protection of stored data comprising protection means to control a signal to enable the programming of a memory, the programming being permitted when the enabling signal is in a first state and prohibited when the enabling signal is in a second state, the protection means including a supply voltage drop detection device to set the enabling signal in the second state when the supply voltage is below a threshold, said device further comprising a time delay circuit capable of setting the enabling signal in the second state during a given period when a control signal goes into a first state.

28 Claims, 1 Drawing Sheet

DEVICE FOR THE PROTECTION OF STORED DATA USING A TIME DELAY CIRCUIT

BACKGROUND OF THE INVENTION

1. Field of the Invention

The invention relates to the field of non-volatile memories. More particularly, it relates to a device for the protection of stored data against parasitic programming operations.

The most important feature of non-volatile memories is the fact that they guarantee the integrity of the data stored in these memories. Today, in most memories, this guarantee is provided by two types of devices: supply voltage drop detection circuits (also known as Vcc Low detection circuits) and devices for the logic write-protection of data (also known as software data protection devices).

The term "memory" is understood to mean an independent memory as well as a memory used in a circuit comprising other elements.

2. Discussion of the Related Art

Supply voltage drop detection type circuits are detection circuits that prohibit programming (namely the modification of the stored data, also called writing) if the supply voltage of the memory (or of the circuit comprising the memory) is below a certain value. This is an analog type of protection. Very often, the supply voltage drop detection and power-on reset functions are not distinguished from one another.

Devices for the logic write-protection of data generally take the form of a programmable and non-volatile internal control register whose contents represent authorization of programming or prohibition of programming. This internal register is programmed by the circuit that controls the memory (for example a microprocessor or a microcontroller, if the memory is an independent circuit). This is logic type protection.

Both devices may be called "write inhibit" devices.

Each of these two devices has drawbacks

Let us assume that the supply voltage of a memory in operation, in which writing is permitted, starts dropping. Above a certain value, the control device (for example a microcontroller) that controls the memory works accurately. When the voltage reaches a first threshold VA, the microcontroller detects the fact that the supply has dropped. Depending on the applications and depending on its duration, this phase is used, for example, to carry out operations for emergency saving of data in the memory or, as the case may be, to program the register of the device for the logic write-protection of data so as to protect the memory against parasitic writing operations. It is also possible to configure the memory so that parasitic programming becomes more difficult, for example, by configuring the memory in read mode.

When the voltage reaches a threshold VB that is lower, in terms of absolute value, than VA, the control device no longer works properly and behaves in a totally unpredictable way. In particular, it may very well send write orders to the memory. In this case, the device for the logic write-protection of data, if it has been programmed to prohibit any programming, is a protection that is not completely reliable. Somewhere in the memory of the microcontroller, there necessarily exists a program for configuration of the register of the device. It may happen that the microcontroller accesses this program and thus modifies the contents of the register, permitting the writing operation. The probability that this program will be run is nevertheless far smaller than the probability of parasitic writing inasmuch as, conventionally, programming of the register requires at least three consistent clock cycles (whereas a parasitic writing operation may get activated on a single cycle).

When the voltage reaches a third threshold VC that is smaller, in terms of absolute value, then VB, the supply voltage drop detection circuit incorporated in the memory detects the drop in voltage and then automatically prohibits any command for writing in the memory.

The critical period in terms of integrity of the data elements of the memory is therefore located between the thresholds VB and VC, that is to say between the time when the drop in supply voltage induces a random behavior of the control device and the time when this drop induces an automatic prohibition of any programming.

One approach would consist in choosing VC>VB. However, it is difficult in practice to make detection circuits having a threshold VC that is stable as a function of the temperature and parameters of manufacture. Typically, to date, the devices that have been implanted in memories have a variation of ±0.2 volts depending on the manufacturing parameters and ±0.3 volts depending on the temperature. There is therefore an uncertainty of ±0.5 volts about the value of VC.

Furthermore, the threshold VB is generally located very close to the minimum value of the supply voltage above which manufacturers guarantee normal operation of the circuits. If VC>VB, there is therefore a risk of blocking the memory whereas it should work normally.

For example, for a circuit supplied by a supply voltage of 5 volts, typically efficient operation is guaranteed between 4.5 and 5.5 volts. The threshold VB will be typically placed at 4.3 volts and VC will be equal to 3.8 volts ±0.5 volts.

SUMMARY OF THE INVENTION

It is an object of the invention to provide a device for the protection of stored data elements that is more reliable.

To achieve this and other objects, there is proposed a combined system of protection that is implemented by logic means but whose stoppage is independent of the logic control signals. Thus, if the protection is implemented before the supply voltage has reached a level such that the circuits driving the memory have random behavior, a random behavior of this kind will, if it occurs, have no effect on the data element whatever the signals produced by the driving circuits.

According to the invention, a time delay, with a duration that is programmable if necessary, is activated. This time delay prevents writing throughout its duration. Whatever the signal sent by the control device, write access is protected throughout the period of the time delay.

Having detected the threshold VA, the control device will, for example, perform the emergency saving operations and if necessary configure the device for the logic write-protection of data. Then it will perform the starting program of the time delay circuit in a loop. When the threshold VB has been reached, the memory is thus protected throughout the period of the time delay. It is enough to provide for a time delay with a duration greater than the typical duration that elapses between the point in time when the supply voltage reaches VB and the point in time when it reaches VC. Since this duration generally depends on the application (and more particularly on the total capacitive charge tolerated by the supply of the circuit), it will preferably be chosen to have a time delay with a programmable duration. If the drop in voltage is only temporary and the voltage goes back above the threshold VB without the threshold VC being reached, the memory works normally as soon as the period of the time delay comes to an end.

Thus, the invention provides a device for protection of stored data comprising protection means to control a signal to enable programming of a memory, the programming being permitted when the enabling signal is in a first state and prohibited when this signal is in a second state, the protection means including a supply voltage drop detection device to set the enabling signal in the second state when the supply voltage is below a threshold, said device further comprising a time delay circuit capable of setting the enabling signal in the second state during a given period when a control signal goes to a first state.

According to one embodiment, the time delay circuit includes a flip-flop circuit to produce a signal setting the enabling signal in its second state when the control signal goes into its first state, a counter to produce a counting value when the signal is in its first state, a register to store a value representing the period and a comparator to reset the flip-flop circuit when the counting value is equal to the value representing the period.

Advantageously, the register of the time delay circuit is programmable.

The invention also relates to the use of the device in a memory or circuit comprising a memory to prevent the programming of the data elements stored in the memory.

BRIEF DESCRIPTION OF THE DRAWINGS

Other advantages and features shall appear from the following description of an exemplary embodiment of the invention, to be read together with the appended drawings, of which.

DETAILED DESCRIPTION

Figure 1:
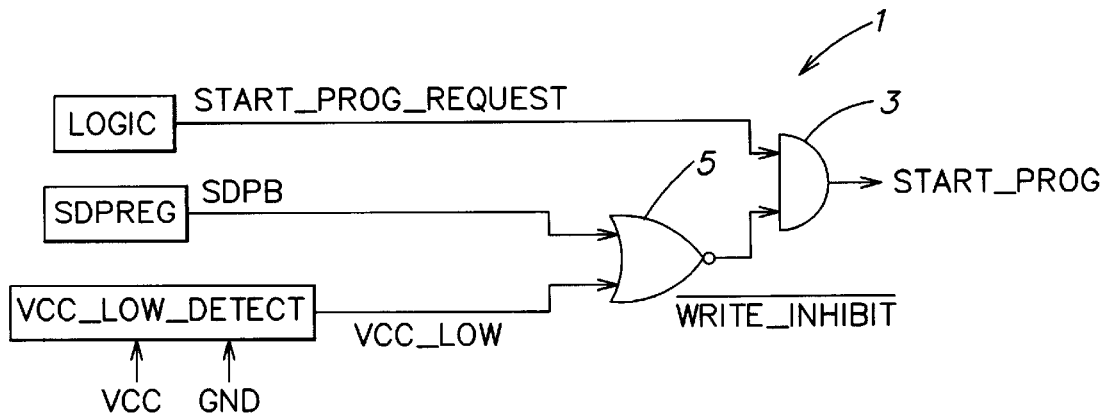
FIG. 1 shows a protection device according to the prior art.

FIG. 1 shows a device 1 for protection, in programming, of data stored in a memory according to the prior art. This device can be implemented in a non-volatile memory or a circuit comprising such a memory.

The device 1 has a control logic circuit LOGIC. This circuit, which is not described, will be, for example, the circuit for decoding the control signals received from the exterior if the device 1 is integrated into an independent memory or else again the control circuit of the memory if the device 1 is used in a circuit comprising a memory. The circuit LOGIC produces the control logic signals used in the device 1 to manage the protection of the data.

Conventionally, programming is permitted or prohibited by the positioning of a logic signal /WRITE_INHIBIT for the enabling of programming (the notation /X represents the signal complementary to X) respectively in a first logic state called an inactive state or a second logic state called an active state. For example, it will be assumed that the inactive state is the high state and the active state is the low state.

When a programming command is sent to the circuit LOGIC, this circuit positions a logic signal START_PROG_REQUEST in a given logic state called an active state. It will be assumed here that this logic state is the high state, the low state being called inactive. One skilled in the art will appreciate that the states could be interchanged so that the high state is the inactive state and the low state is the active state. This signal is combined with the signal /WRITE_INHIBIT to produce a programming command logic signal START_PROG so that data is programmed when this signal is in a given state called the active state (it will be assumed here that this state is the high state) and so that no programming is done when this signal is in a state called an inactive state (in the example it will be assumed that it is the low state). Conventionally, the protection is expressed by the fact that the signal START_PROG remains inactive whatever the state of the signal START_PROG_REQUEST if the signal /WRITE_INHIBIT is active. If the signal /WRITE_INHIBIT is inactive, then the state of the signal START_PROG is identical to the state of the signal START_PROG_REQUEST.

Thus, in the example shown in FIG. 1, the signal START_PROG is produced by a AND type logic gate 3 receiving the signals /WRITE_INHIBIT and START_PROG_REQUEST so that START_PROG=1 if START_PROG_REQUEST=/WRITE_INHIBIT=1.

The device 1 includes a logic protection non-volatile register SDPREG. It also includes a supply voltage drop detection circuit VCC_LOW_DETECT receiving, at input, a high supply potential VCC and a ground potential GND supplying the circuit to be protected and producing a logic signal VCC_LOW such that VCC_LOW is in a first logic state (called an inactive state) if VCC is greater than a given threshold Vthreshold and in a second state (called an active state) if it is lower.

For example, VCC_LOW=1 if VCC<Vthreshold, if not VCC_LOW=0.

Let SDPB be the contents of the register SDPREG. It will be assumed that SDPB=1. Then any programming is prohibited.

A NOR type logic gate 5 receives the signals VCC_LOW and SDPB and uses these signals to produce the signal /WRITE_INHIBIT.

Thus, if the memory is protected against programming by logic means and/or if VCC is below Vthreshold, then the programming commands of the memory are inhibited and have no effect.

Figure 2:
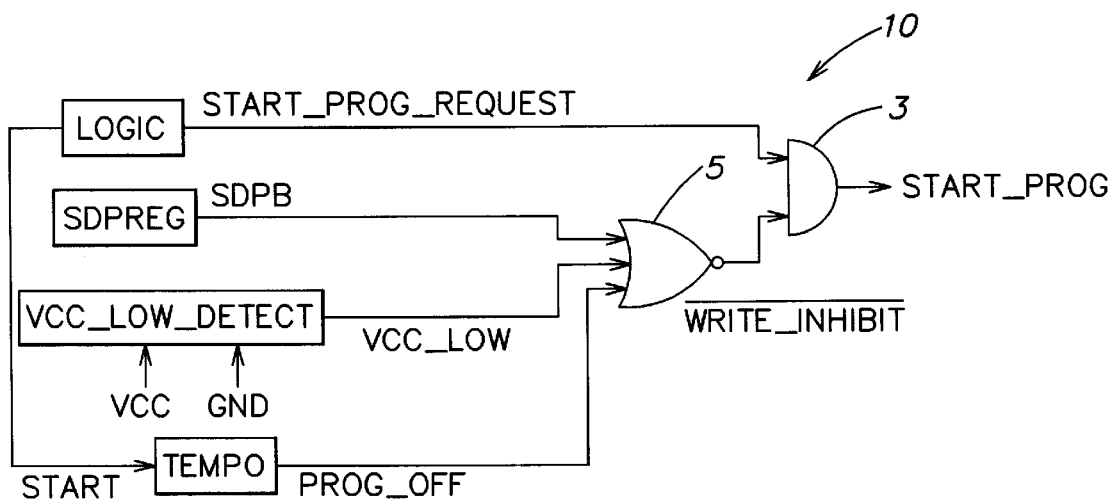
FIG. 2 shows a protection device according to the invention.

FIG. 2 illustrates a protection device 10 similar to that of FIG. 1, implementing the invention.

It comprises, in addition to the elements of FIG. 1 (bearing the same references as in FIG. 1), a delay line or time delay circuit TEMPO producing a logic signal PROG_OFF and the gate 5 comprises a third input to receive the signal PROG_OFF. When the signal PROG_OFF is in a first state, called an active state, the signal /WRITE_INHIBIT goes into its active state. When the signal PROG_OFF is in a second state, called an inactive state, the activation of the signal /WRITE_INHIBIT is controlled by the devices VCC_LOW_DETECT and SDPREG in a manner similar to that of the example shown in FIG. 1.

The circuit TEMPO receives a control signal START, for example from the circuit LOGIC, in such a way that the signal PROG_OFF is active for a specific period when the control signal START received goes into a given state and is inactive once the period has elapsed or if the signal START is in another state. Typically, the period chosen will be equal to a few hundreds of milliseconds.

Figure 3:
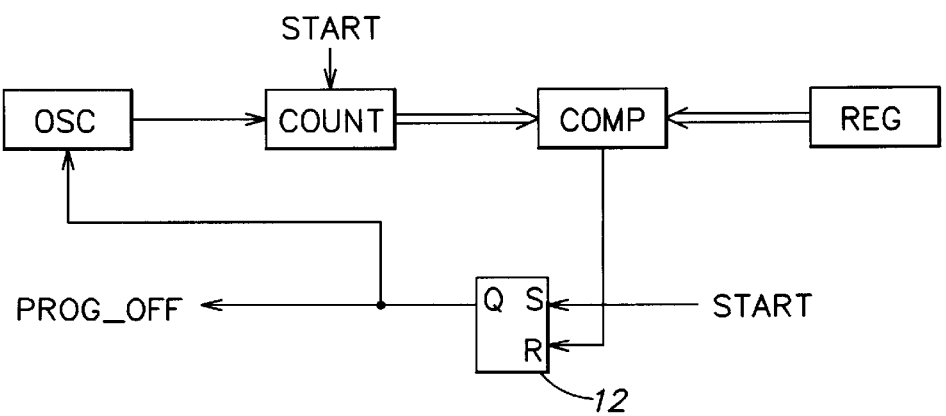
FIG. 3 shows a schematic view of an exemplary embodiment of a time delay circuit of the device of FIG. 2.

FIG. 3 illustrates an exemplary embodiment of the circuit TEMPO.

It has a register REG, a comparator COMP, a counter COUNT, an oscillator OSC and a flip-flop circuit 12.

The comparator is used to compare the value stored in the register REG with the value produced by the counter COUNT. It produces a logic signal whose state is a function of the result of the comparison, this signal being given to the resetting input of the flip-flop circuit 12. It will be assumed that the signal produced by the comparator goes to the high state if the values are equal.

The output of the flip-flop circuit 12 gives the signal PROG_OFF, this signal being given to the oscillator OSC in such a way that it produces a clock signal if the signal PROG_OFF is active.

The resetting input S of the flip-flop circuit 12 receives the signal START. The signal START is given also to the counter in such a way that it starts counting for example by incrementing its constant from 0 onwards at the rate of the signal given by the oscillator when the signal START goes into its active state. When the value produced by the counter reaches the value stored in the resister REG, then the signal produced by the comparison circuit COMP has a leading edge such that the signal PROG_OFF goes back to the inactive state.

Preferably, the register REG chosen will be a programmable register or a once-programmable register, in such a way that the period of activation of the signal PROG_OFF can be adapted to the application, and more particularly to the typical slope of the drop in supply voltage which depends on the total capacitive charge tolerated by the supply.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for protection of data stored in a memory comprising protection means for controlling an enabling signal that enables programming of a memory, the programming being permitted when the enabling signal is in a first state and prohibited when the enabling signal is in a second state, the protection means including a supply voltage drop detection device arranged to set the enabling signal in the second state when the supply voltage is below a threshold value, said device further comprising a time delay circuit constructed and arranged to receive a control signal independent of said supply voltage drop detection device, said time delay circuit being capable of setting the enabling signal in the second state for a given period after receiving the control signal.

2. A device according to claim 1, wherein the time delay circuit includes a flip-flop circuit to produce a signal setting the enabling signal in its second state when the control signal goes into its first state, a counter to produce a counting value when the signal is in its first state, a register to store a value representing the period and a comparator to reset the flip-flop circuit when the counting value is equal to the value representing the period.

3. A device according to claim 2, wherein the register of the time delay circuit is programmable.

4. A system for protecting stored data, comprising a protection circuit for providing a controllable signal that enables the programming of a memory for the stored data; said protection circuit signal assuming one of a first state for permitting the programming and a second state for prohibiting the programming, the protection circuit including:

a supply voltage detection circuit constructed and arranged to provide a first control signal that sets the protection circuit signal to its second state when a supply voltage value is below a predetermined threshold value; and a time delay circuit constructed and arranged to receive a second control signal independent of said first control signal and arranged to set the protection circuit signal to its second state during a set time period.

5. A system according to claim 4 wherein the time delay circuit includes a flip-flop circuit to produce a signal setting the enabling signal to second state when the control signal goes to its first state.

6. A system according to claim 5 wherein the time delay circuit further includes a counter to produce a counting value when the control signal is in its first state.

7. A system according to claim 6 wherein said time delay circuit further includes a register to store a value representing the period.

8. A system according to claim 7 wherein said time delay circuit further includes a comparator to reset the flip-flop circuit when the counting value is equal to the value representing the period.

9. A system according to claim 8 wherein the register of the time delay circuit is programmable.

10. A system according to claim 4 further including a control logic circuit.

11. A system according to claim 10 wherein said protection circuit further includes an AND gate.

12. A system according to claim 11 including a gate for coupling between said detection means and said AND gate.

13. A system according to claim 12 wherein said gate intercoupling said detection circuit and said AND gate includes a NOR gate.

14. A system according to claim 13 including a further register coupled to a second input of the NOR gate.

15. A system according to claim 14 wherein said second control signal is a start signal coupled from said control logic circuit to said time delay circuit.

16. A system according to claim 15 wherein said NOR gate is a three input NOR gate having a second input coupled from said detection circuit and a third input coupled from said time delay circuit.

17. A device for protecting stored data comprising protection means for providing a programming enable signal that enables the programming of a memory; said protection means programming enable signal assuring one of a first state for permitting the programming and a second state for prohibiting the programming the protection means including:

a supply voltage drop detection means for providing a first control signal that sets the protection means enable signal to its second state when a supply voltage value is below a predetermined threshold value;

a time delay means for receiving a second control signal and for providing a PROGOFF signal even without said supply voltage value being below said predetermined threshold value, said PROGOFF signal being independent of the supply voltage drop detection means; and means for coupling said PROGOFF signal from said time delay means to said first control signal for assuring the second state for prohibiting programming during a set time period.

18. A device in accordance with claim 17 wherein said time delay means includes a flip-flop means to produce a signal setting the enabling signal into its second state when the control signal goes to its first state.

19. A device in accordance with claim 18 wherein said time delay means further includes a counter to produce a counting value when the control signal is in its first state.

20. A device in accordance with claim 19 wherein said time delay means further includes a register means to store a value representing the period.

21. A device in accordance with claim 20 wherein said time delay means further includes a comparator to reset the flip-flop means when the counting value is equal to the value representing the period.

22. A device in accordance with claim 21 wherein said register means of the time delay means is programmable.

23. A device in accordance with claim 17 wherein said protection means includes a control logic circuit.

24. A device in accordance with claim 23 wherein said protection means comprises an AND gate.

25. A device in accordance with claim 24 further including a NOR gate coupled between said supply voltage drop detection means and said protection means.

26. A device in accordance with claim 25 further including a further register coupled to one input of the NOR gate.

27. A device in accordance with claim 26 wherein said NOR gate has two other inputs, one coupled from said supply voltage drop detection means and another from said time delay means.

28. A device in accordance with claim 27 wherein said second control signal includes a start signal coupled from said control logic circuit means to said time delay means.

* * * * *